(12) United States Patent
Hartenstein

(10) Patent No.: US 8,897,032 B2
(45) Date of Patent: Nov. 25, 2014

(54) SURFACE MOUNT ANTENNA CONTACTS

(75) Inventor: Abraham Hartenstein, Chatsworth, CA (US)

(73) Assignee: Xirrus, Inc., Thousand Oaks, CA (US)

( * ) Notice: Subject to any disclaimer, the term of this patent is extended or adjusted under 35 U.S.C. 154(b) by 535 days.

(21) Appl. No.: 13/114,875

(22) Filed: May 24, 2011

(65) Prior Publication Data

US 2012/0302074 A1    Nov. 29, 2012

(51) Int. Cl.
| | |
|---|---|
| *H05K 7/14* | (2006.01) |
| *H01R 12/73* | (2011.01) |
| *H05K 3/36* | (2006.01) |
| *H01R 13/02* | (2006.01) |
| *H05K 1/11* | (2006.01) |

(52) U.S. Cl.
CPC ...... *H01R 12/737* (2013.01); *H05K 2201/0311* (2013.01); *H05K 1/117* (2013.01); *H05K 3/366* (2013.01); *H05K 2201/1031* (2013.01); *H05K 2201/10409* (2013.01); *H01R 13/02* (2013.01); *H05K 2201/09181* (2013.01); *H05K 2201/09172* (2013.01)
USPC .......................... 361/799; 361/727; 361/809

(58) Field of Classification Search
USPC ................. 361/792, 807, 809, 810, 756, 727; 174/260–262
See application file for complete search history.

(56) References Cited

U.S. PATENT DOCUMENTS

| | | | | |
|---|---|---|---|---|
| 3,764,955 | A * | 10/1973 | Ward | 439/377 |
| 3,980,376 | A * | 9/1976 | Rosen | 439/327 |
| 4,235,500 | A * | 11/1980 | Belopavlovich et al. | 439/495 |
| 4,576,427 | A * | 3/1986 | Verbruggen | 439/592 |
| 4,712,848 | A * | 12/1987 | Edgley | 439/327 |
| 5,692,920 | A * | 12/1997 | Banakis et al. | 439/342 |
| 6,442,044 | B2 * | 8/2002 | Farnworth et al. | 361/796 |
| 7,874,867 | B2 * | 1/2011 | Takahashi et al. | 439/496 |
| 8,033,838 | B2 * | 10/2011 | Eldridge et al. | 439/81 |

* cited by examiner

*Primary Examiner* — Hung S Bui
(74) *Attorney, Agent, or Firm* — Francisco A. Rubio-Campos; The Eclipse Group, LLP

(57) ABSTRACT

A method and system for connecting a vertical printed circuit board with a horizontal printed circuit board where a contact device is biased in a first position when not contacting a vertical printed circuit board and is biased in a second position when the vertical printed circuit is coupled to the horizontal printed circuit board.

16 Claims, 6 Drawing Sheets

US 8,897,032 B2

SURFACE MOUNT ANTENNA CONTACTS

BACKGROUND

1. Field of the Invention

This invention relates to antenna devices and more particularly to systems and methods for coupling antennas to printed circuit boards.

2. Description of Related Art

The use of wireless communication devices for data networking continues to grow at a rapid pace. Data networks that use "WiFi" ("Wireless Fidelity"), also known as "Wi-Fi," are relatively easy to install, convenient to use, and supported by the IEEE 802.11 standard. WiFi data networks also provide performance that makes WiFi a suitable alternative to a wired data network for many business and home users.

WiFi networks operate by employing wireless access points that provide users, having wireless (or "client") devices in proximity to the access point, with access to varying types of data networks such as, for example, an Ethernet network or the Internet. The wireless access points include a radio that operates according to the standards specified in different sections of the IEEE 802.11 specification. Generally, radios in the access points communicate with client devices by utilizing omni-directional antennas that allow the radios to communicate with client devices in any direction. The access points are then connected (by hardwired connections) to a data network system that completes the access of the client device to the data network. The different standards under IEEE 802.11 define 'channels' that wireless devices, or clients, use when communicating with an access point.

These wireless access points and client devices typically have external or internal antennas. If internal antennas are employed in wireless access points and client devices, they are often connected to printed circuit boards (PCBs) by directly soldering the antenna to the PCB or with expensive connectors. Both approaches suffer from increasing cost either directly with hardware cost or indirectly with cost associated with complex soldering approaches caused by the size and angle of the installed antenna. Also, the physical size of connectors used in other approaches often makes use of those connectors impossible in highly integrated assemblies.

Thus, there is a need for a system and approach for rapidly and cost effectively installing antennas on PCBs.

SUMMARY

A system and method for surface mounting contacts for use in high density assemblies where more than one PCB is required to be connected electrically, such as an antenna PCB to a controller PCB regardless of signal type (RF, digital or analog environment) while reducing direct and indirect cost. The contact device is formed from a single material and mounted on a first PCB biased in a first position when at rest and in a second position when in electrical contact with a second PCB.

DETAILED DESCRIPTION

In the following description of the preferred embodiment, reference is made to the accompanying drawings that form a part hereof, and which show, by way of illustration, a specific embodiment in which the invention may be practiced. Other embodiments may be utilized and structural changes may be made without departing from the scope of the present invention.

Figure 1:
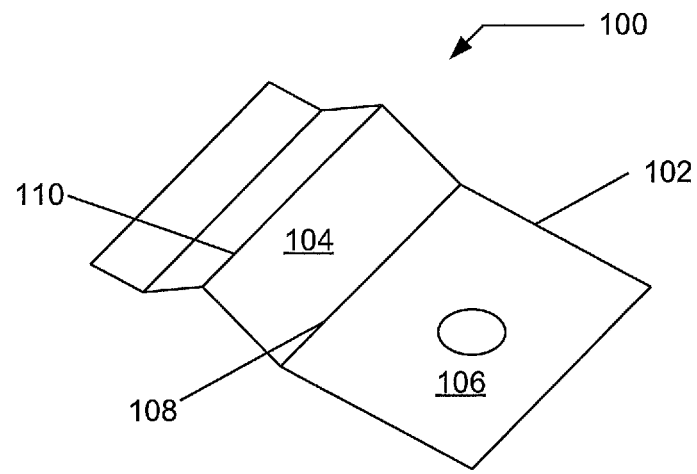
FIG. 1 is a perspective view of a contact device in accordance with an example implementation of an embodiment of the invention.

In FIG. 1, a perspective view 100 of a contact device 102 in accordance with an example implementation of an embodiment of the invention is shown. The contact device 102 may be formed by micro stamping a conductive metal alloy; examples of such alloys may include brass with nickel and silver as described in the Copper Development Association, Copper Alloy Spring Materials, CDA Publication TN12, 1973. It is desirable to choose a conductive alloy that is a spring material with reduced corrosion characteristics. The contact device is created with a raised portion 104 and may also have an anchor portion 106 or pad. The raised portion 104 may be formed out of the alloy by having a first bend 108 that raises a portion of the contact device 104 and a second bend 110 that is in the opposite direction of the first bend Turning to FIG. 2, a top and side view 200 of the contact device 102 of FIG. 1 is shown. The contact device 102 has a first position without contacting a vertical PCB and a second position when engaged with the vertical PCB board. The contact device 102 is biased to the first position and exerts a biasing force in the second position against an inserted vertical PCB as shown in FIG. 3. The biasing force is created upon downward pressure being placed upon a raised portion 104 of the contact device. The raised portion 104 may be compressed by the vertical PCB board with the raised section 104 being moved from the biased first position to the second position. An anchor point 106 or pad may also include a protruding member 202 that aids in the anchoring of the contact device.

Figure 2:
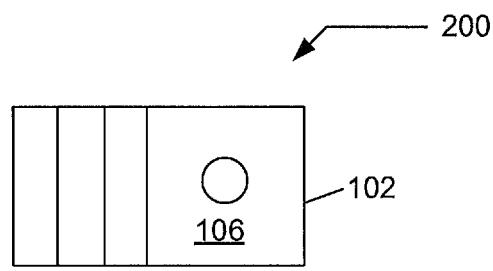
FIG. 2 is a top and side view of the contact device of FIG. 1.
Figure 2:
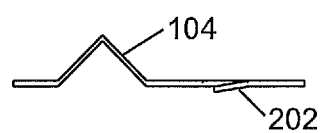
Figure 3:
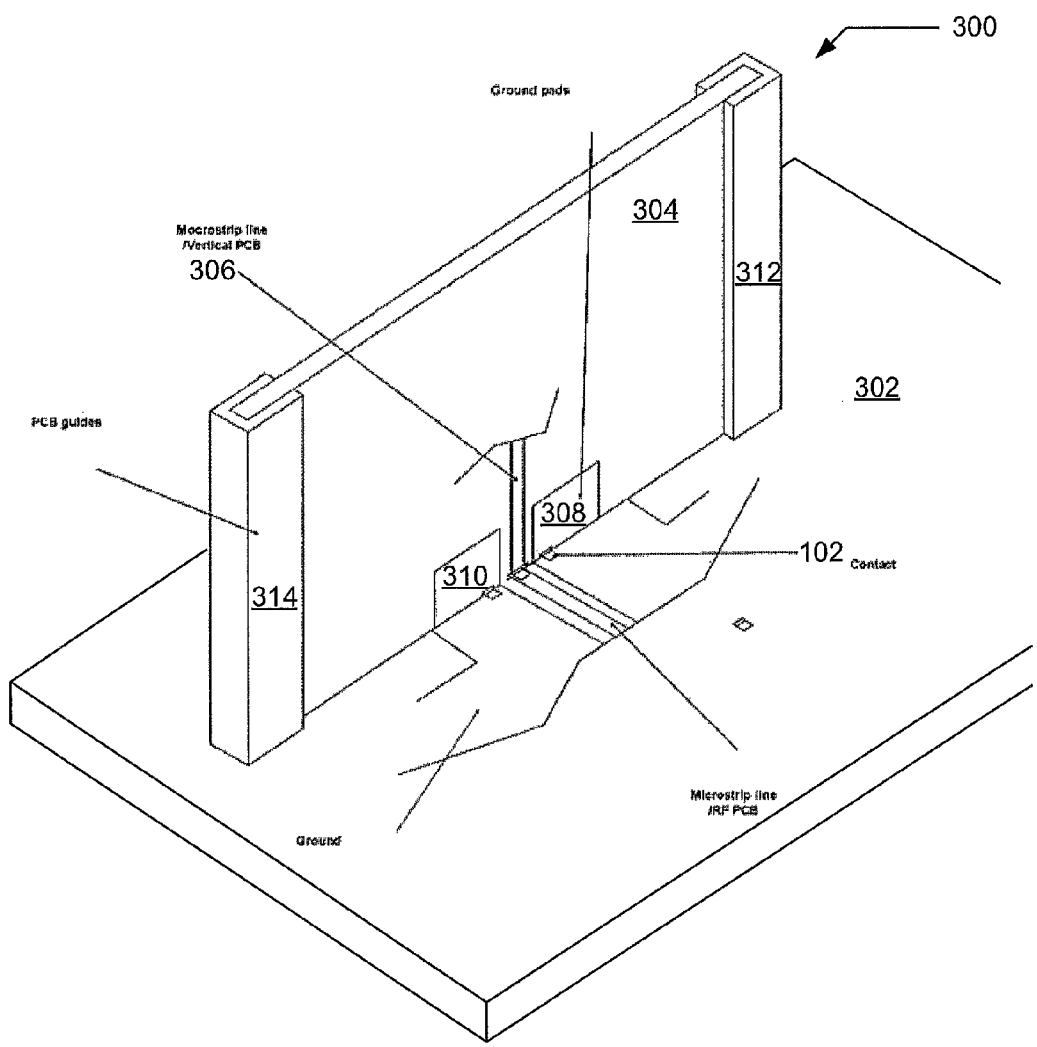
FIG. 3 is a perspective view of the contact device of FIGS. 1 and 2 in a contact application with a vertical PCB and a horizontal PCB in accordance with an example implementation of an embodiment of the invention.

In FIG. 3, a perspective view 300 of the contact device 102 of FIGS. 1 and 2 mounted on a horizontal PCB 302 connecting with a vertical PCB 304 in accordance with an example implementation of an embodiment of the invention. The vertical PCB 304 may have microstrip contact lines, such as 306 and ground pads 308 and 310 that may wrap on the side wall of the vertical PCB 304 substrate (the side walls may contain conductive metal for connection with the microstrip contact lines). The boundaries for the wrap around microstrip contact lines and ground pads may be achieved by drilling/routing operations. To ensure that the vertical PCB 304 and microstrip contact lines/pads of vertical PCB 304 create enough pressure against the contacts on horizontal PCB 302, such as contact device 102, and biases the contacts to a second position, one or more guides (312 and 314) may be used.

Figure 4:
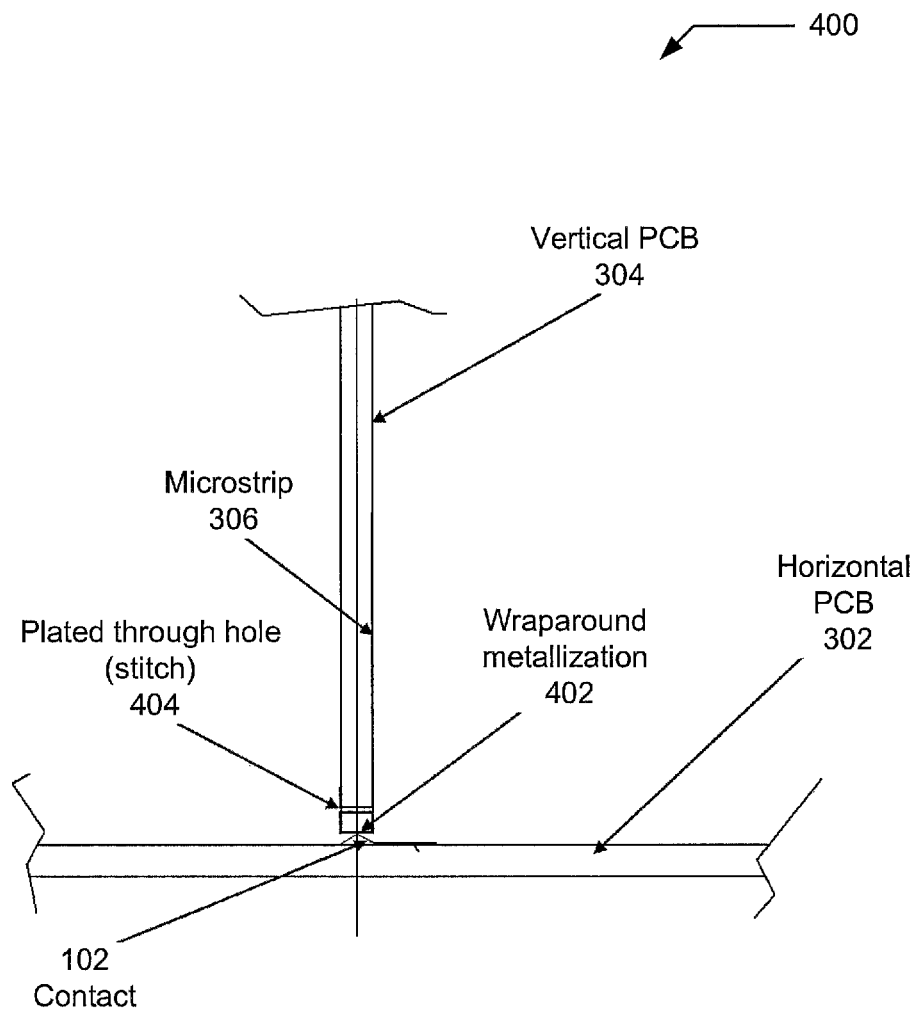
FIG. 4 is a side view of the vertical PCB and the horizontal PCB of FIG. 3.

Turning to FIG. 4, a side view of the vertical PCB 304 and horizontal PCB 302 of FIG. 3 is depicted. The vertical PCB 304 is shown with the microstrip contact line 306 extending to the edge of vertical PCB 304 and then wrapping around the edge of the PCB (wraparound metallization 402). The microstrip contact line 306 may be extended a bit more on the far side of the vertical PCB 304, and then plated (stitched) through hole 404 in order to prevent the wraparound contact from peeling off. When the vertical PCB 304 is placed over the horizontal PCB 302 and contact 102, the contact interface or coupling formed is robust and reliable.

It is also noted that the vertical PCB 304 is seated on top of the contact 102 which show the efficient use of space by the contact on the horizontal PCB 302. In other implementations, the contact 102 may engage a corner of the vertical PCB 304 rather than a side.

Figure 5:
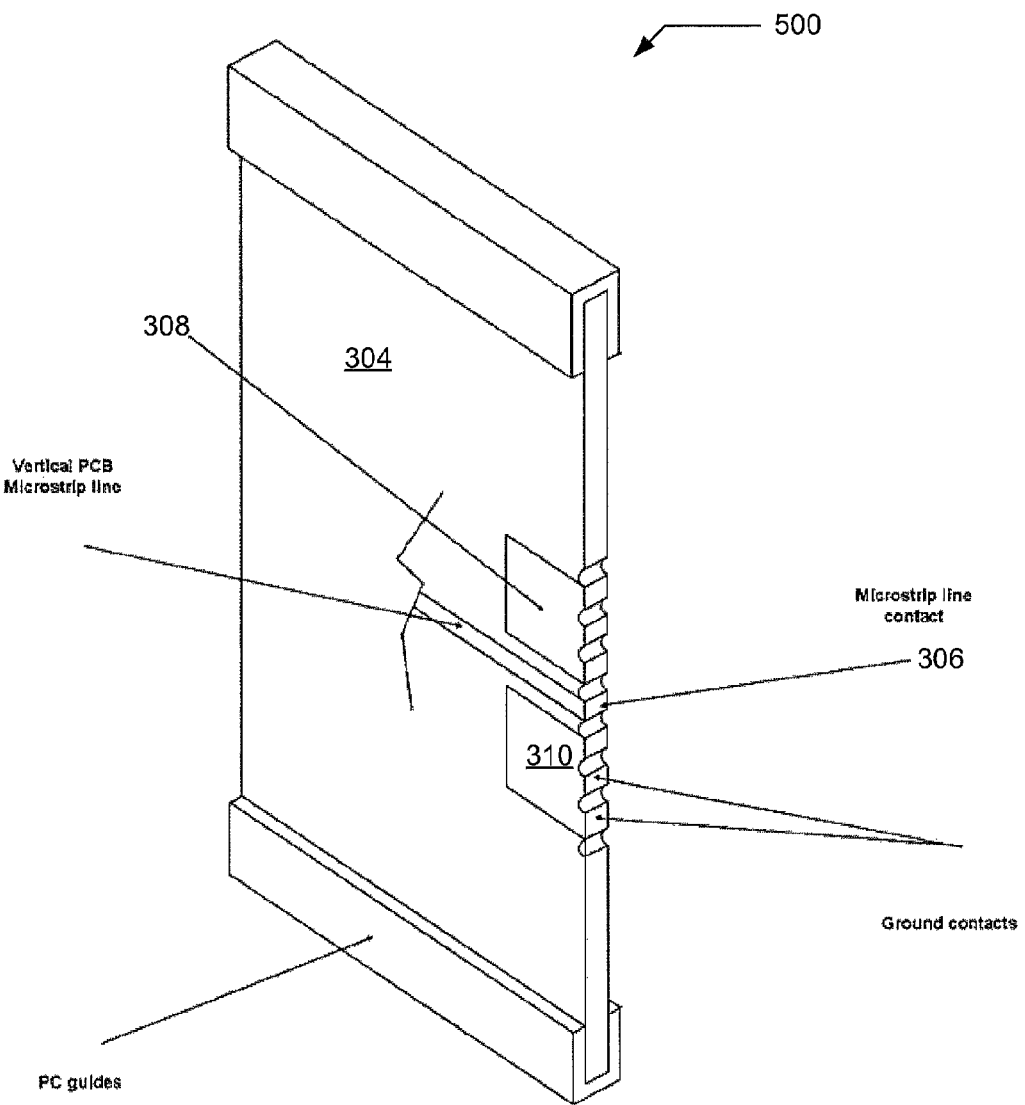
FIG. 5 is a perspective view of the vertical PCB of FIG. 3.

In FIG. 5, a perspective bottom side view 500 of the vertical PCB of 304 of FIG. 3 is shown. The ground pads 308 and 310 wrap around the edge of vertical PCB 304. The ground pads are shown to be drilled (or in other implementations routed) prior to be metalized (by coating or etching). As noted in FIG. 4, the microstrip contact line 306 may also be seen as extending around the edge of vertical PCB 304.

Figure 6:
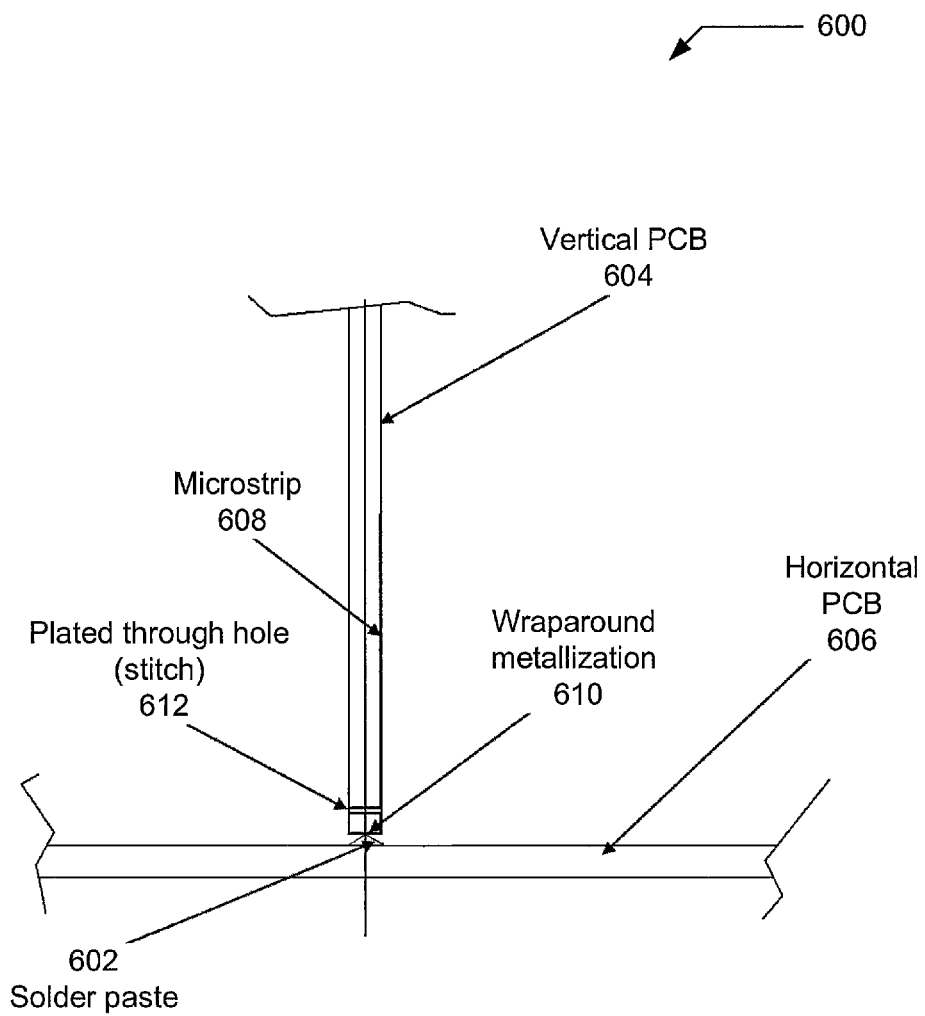
FIG. 6 is a side view of a contact device between a vertical PCB and a horizontal PCB in accordance with another example implementation of an embodiment of the invention.

Turning to FIG. 6, a side view 600 of a contact device 602 between a vertical PCB 604 and horizontal PCB 606 in accordance with another example implementation of an embodiment of the invention is shown. A microstrip 608 may be applied to the vertical PCB 604 that wraps around the edge and results in wraparound metallization 610. The microstrip 608 may be plated through or stitched through a hole 612 to help secure the microstrip to the vertical PCB 604. The contact device 602 may be achieved with solder paste in between the microstrip 608 of the vertical PCB 604 and a pad or other electronic contact on the horizontal PCB 606. The solder paste may be solidified during the surface mounting of devices on the horizontal PCB 606. The solder paste in FIG. 6 is shown prior to solidifying.

Figure 7:
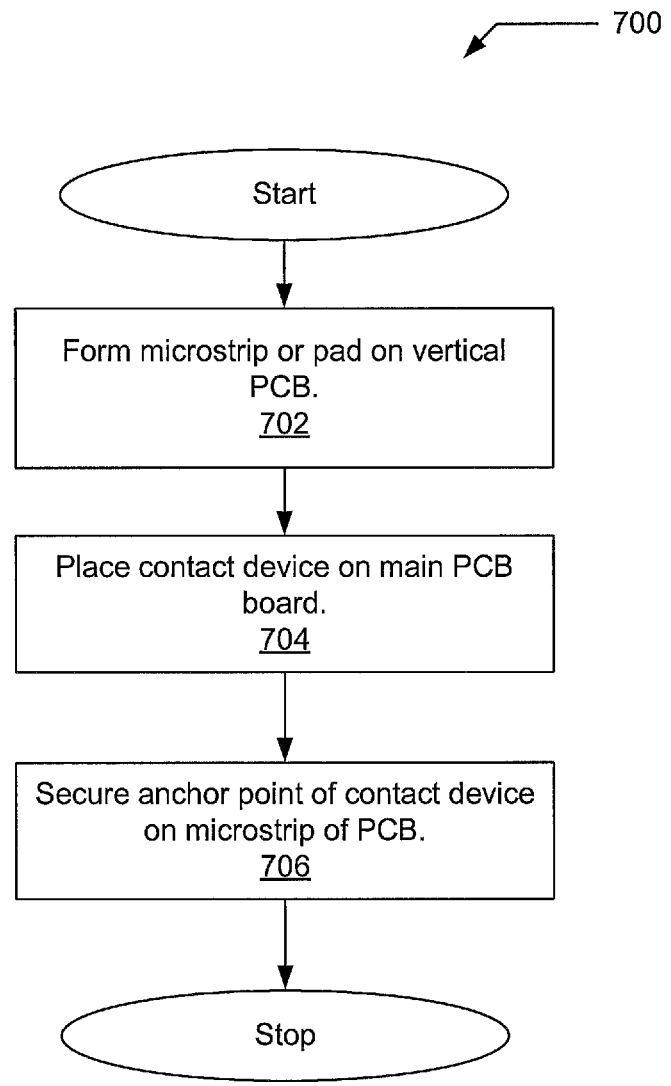
FIG. 7 is a flow diagram of an application of the contact device of FIGS. 1 and 2 on to a PCB in accordance with an example implementation of an embodiment of the invention.

In FIG. 7, a flow diagram 700 of an example application of the contact device 102 of FIG. 1 to a horizontal PCB 302 of FIG. 3 in accordance with an example implementation of an embodiment of the invention is shown. A contact area (microstrip contact lines 306 or pads 308 and 310) may be formed 702 on a vertical PCB (such as PCB 304). A contact device 102 may then be placed upon the contact area (microstrip contact lines 306 or on a pad) 704 on the main PCB board (such as horizontal PCB 302). The anchor point 106 of the contact device 102 is then secured to main PCB board with solder 706. This may be accomplished by initially securing the anchor point 106 and then flow soldering over the contact device 102. Other soldering or electro-coupling may be employed such as riveting or screwing.

Further, one or more of the vertical PCBs may have an antenna formed on or in it. In other implementations, the vertical PCB may be another circuit board that contains subassemblies of an electronic device. The contact device 102 is shown being mounted on the horizontal PCB, in other implementations the contact device may be mounted on the vertical PCB or a combination of both vertical and horizontal PCBs.

The invention illustratively disclosed herein suitably may be practiced in the absence of any element, part, step, component, or ingredient which is not specifically disclosed herein.

While in the foregoing detailed description this invention has been described in relation to certain preferred embodiments thereof, and many details have been set forth for purposes of illustration, it will be apparent to those skilled in the art that the invention is susceptible to additional embodiments and that certain of the details described herein can be varied considerably without departing from the basic principles of the invention.

What is claimed is:

1. A contact device formed out of a single material for surface placement on a horizontal printed circuit board, comprising:
   an anchor portion; and
   a raised portion where the raised portion is biased in a first position when not in electrical contact with a vertical printed circuit board, and is biased in a second position when in electrical contact with the vertical printed circuit board, where the contact device exerts a biasing force in the second position upon downward pressure being placed by the vertical printed circuit board upon the raised portion of the contact device and where the raised portion is formed by a first bend spaced apart from a second bend in a direction opposite that of the first bend.

2. The contact device of claim 1, where the single material is a metal alloy.

3. The contact device of claim 2, where the metal alloy is a copper alloy.

4. A printed circuit board, comprising:
   a contact area;
   a contact device formed out of a single material coupled to the contact area on the printed circuit board where the contact device includes:
   an anchor portion; and
   a raised portion where the raised portion is biased in a first position at rest and exerts a biasing force in a second position when in electrical contact with another printed circuit board and where the raised portion is formed by a first bend spaced apart from a second bend in a direction opposite that of the first bend.

5. The printed circuit board of claim 4, where the single material is a metal alloy.

6. The printed circuit board of claim 5, where the metal alloy is a copper alloy.

7. The printed circuit board of claim 4, where the contact device is coupled to the contact area with solder and the contact area is a microstrip contact line.

8. An electrical system with at least two printed circuit boards, comprising:
   a first printed circuit board with a contact;
   a contact device formed out of a single material coupled to the contact on the first printed circuit board where the contact device includes:
   an anchor portion; and
   a raised portion where the raised portion is biased in a first position at rest and exerts a biasing force in a second position when in electrical contact with a second printed circuit board and where the raised portion is formed by a first bend spaced apart from a second bend in a direction opposite that of the first bend; and
   at least one guide coupled to the first printed circuit board that is able to secure the second printed circuit board that engages the contact device and maintains the contact device in the second position.

9. The electrical system of claim 8, where the single material is a metal alloy.

10. The electrical system of claim 9, where the metal alloy is a copper alloy.

11. The printed circuit board of claim 8, where the contact device is coupled to the contact with solder.

12. The printed circuit board of claim 8 where the contact is a microstrip contact line.

13. A method of connecting a first printed circuit board with a second printed circuit board, comprising:

forming a contact on the first printed circuit board;

securing a contact device that is made out of a single material on the second printed circuit board, where the contact device includes an anchor portion that is secured to the second printed circuit board and a raised portion formed by a first bend spaced apart from a second bend in a direction opposite that of the first bend;

biasing the contact device in a first position at rest; and exerting a biasing force in a second position upon downward pressure being placed by the first printed circuit board upon the raised portion of the contact device when in electrical contact with the contact on the first printed circuit board.

14. The method of connecting a first printed circuit board with a second printed circuit board of claim 13, where forming a contact further includes creating a microstrip on the first printed circuit board.

15. The method of connecting a first printed circuit board with a second printed circuit board of claim 13, where the single material is a metal alloy.

16. The method of connecting a first printed circuit board with a second printed circuit board of claim 13, where the first printed circuit board has at least one antenna formed on or in it.

* * * * *